(12) United States Patent
Hikita et al.

(10) Patent No.: US 6,404,061 B1
(45) Date of Patent: Jun. 11, 2002

(54) SEMICONDUCTOR DEVICE AND SEMICONDUCTOR CHIP

(75) Inventors: Junichi Hikita; Isamu Nishimura; Nobuhisa Kumamoto; Yoshiyasu Morishima, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/512,061

(22) Filed: Feb. 24, 2000

(30) Foreign Application Priority Data

Feb. 26, 1999 (JP) ............................................ 11-051208
Feb. 26, 1999 (JP) ............................................ 11-051209
Aug. 31, 1999 (JP) ............................................ 11-245855

(51) Int. Cl.[7] ........................... H01L 23/48; H01L 23/52
(52) U.S. Cl. ....................... 257/777; 257/693; 257/688; 257/698; 257/730
(58) Field of Search ................................ 257/777, 693, 257/738, 687, 688, 698, 730, 729

(56) References Cited

U.S. PATENT DOCUMENTS 5,239,198 A * 8/1993 Lin et al. ..................... 257/693
6,011,312 A * 1/2000 Nakazawa et al. .......... 257/778
6,087,719 A * 7/2000 Tsunashima ................. 257/686
6,107,679 A * 8/2000 Noguchi ...................... 257/678

FOREIGN PATENT DOCUMENTS

JP         4-370958   * 12/1992   ................. 257/778

* cited by examiner

Primary Examiner—Jasmine J. B. Clark
(74) Attorney, Agent, or Firm—Rader, Fishman & Grauer, PLLC

(57) ABSTRACT

A semiconductor device having a solid device, and a semiconductor chip bonded to the solid device with a back face thereof being opposed to a front face of the solid device. The semiconductor chip has a back electrode provided on the back face thereof and electrically connected to an electrode provided on a front face thereof through a through-hole. The solid device may be a wiring board or another semiconductor chip. Further another semiconductor chip may be stacked and bonded onto the front face of the semiconductor chip.

11 Claims, 9 Drawing Sheets

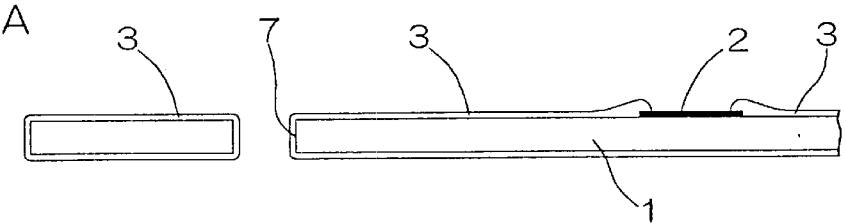
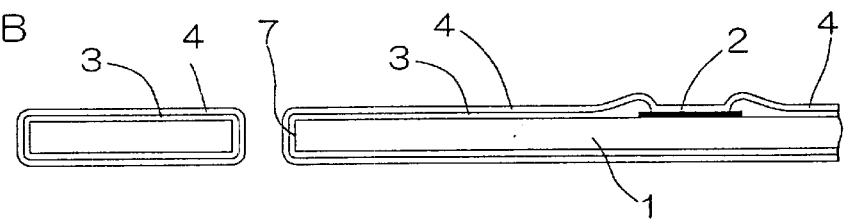
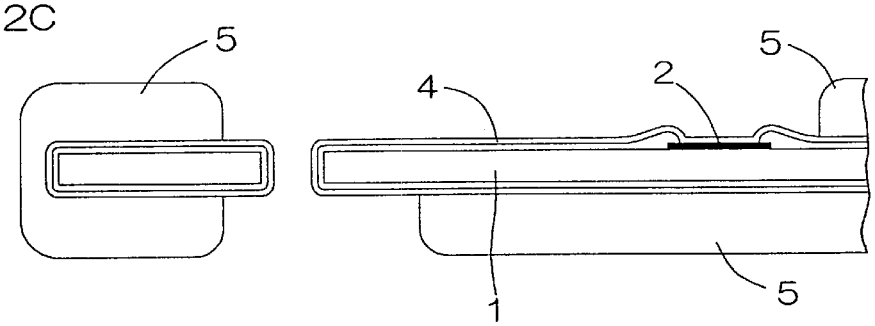
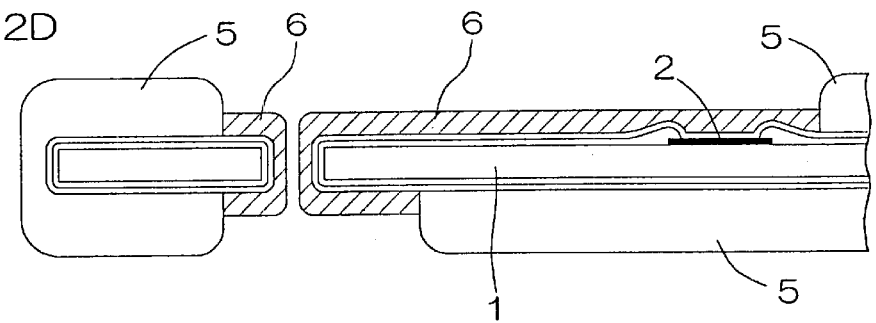
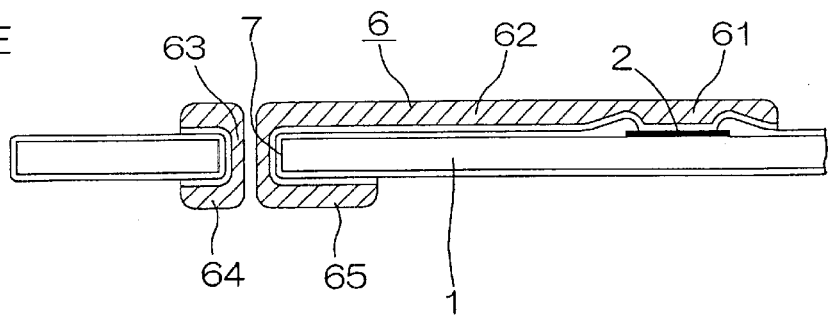

SEMICONDUCTOR DEVICE AND SEMICONDUCTOR CHIP

BACKGROUND OF THE INVENTION

1. Field of the Invention

The present invention relates to a semiconductor device having a solid device (a semiconductor chip or a wiring board) and a semiconductor chip bonded thereto. The invention further relates to a semiconductor chip to be bonded to a solid device.

2. Description of Related Art

For substantial increase in integration level, attention has been directed to semiconductor devices of chip-on-chip structure in which a plurality of semiconductor chips are arranged in a double-stacked relation.

In this case, electrode projections called "bumps" are provided on a device formation surface (active surface) of the semiconductor chips to be stacked, and the semiconductor chips are stacked in a so-called face-to-face relation.

However, the face-to-face bonding merely realizes a double-stacked structure but not a multi-level structure comprising semiconductor chips stacked at three or more levels, thereby posing limitations to higher density integration.

Where a semiconductor chip is mounted by a so-called face-up bonding method to form the chip-on-chip structure, wire interconnection is required for connecting electrodes on a device formation surface of the semiconductor chip to electrodes on an underlying substrate.

More specifically, the TAB (tape automated bonding) technique is employed, by which the electrodes on the device formation surface of the base semiconductor chip are connected to the electrodes of the underlying substrate (e.g., wiring board) via inner leads and the electrodes on the underlying substrate are connected to a printed board or a ceramic board.

The underlying substrate is indispensable for such wire interconnection, so that the underlying substrate cannot be obviated. Further, higher density integration is impossible with a need for an underlying substrate having a larger plan area.

SUMMARY OF THE INVENTION

It is an object of the present invention to provide a semiconductor chip which can be bonded to a solid device (another semiconductor chip or a wiring substrate) with an increased flexibility, thereby realizing higher integration and higher density packaging.

It is another object of the invention to provide a semiconductor device which features an increased flexibility in bonding between a semiconductor chip and a solid device (another semiconductor chip or a wiring board), thereby realizing higher integration and higher density packaging.

A more specific object of the invention is to arrange semiconductor chips in any stacked relation to form a chip-on-chip structure, thereby easily realizing a semiconductor device of multi-level structure comprising semiconductor chips stacked at three or more levels.

Another specific object of the invention is to provide a semiconductor device including a semiconductor chip which can be connected directly to a printed board or the like without the use of an underlying substrate when the semiconductor chip is packaged with its device formation surface facing upward (in a face-up manner).

The semiconductor device according to the present invention comprises a solid device, and a semiconductor chip bonded to the solid device with a back face thereof being opposed to a front face of the solid device, the semiconductor chip having a back electrode provided on the back face thereof and electrically connected to an electrode provided on a front face thereof through a through-hole. The back electrode is bonded, for example, to a connecting portion provided on the front face of the solid device.

The solid device may be another semiconductor chip.

Further another semiconductor chip may be stacked and bonded onto the front face of the semiconductor chip.

The solid device may be a wiring board. In this case, the back electrode is preferably bonded to a lead of the wiring board.

The semiconductor chip according to the present invention comprises a semiconductor substrate formed with a through-hole, a front electrode provided on a front face of the semiconductor substrate as a device formation surface thereof, and a back electrode provided on a back face of the semiconductor substrate and electrically connected to the front electrode through the through-hole.

In accordance with the invention, the back electrode is connected to the front electrode through the through-hole, so that a plurality of semiconductor chips can be connected to each other in any stacked relation such as a face-to-back, face-to-face or back-to-back relation. Thus, a semiconductor device can be realized which has a chip-on-chip structure comprising semiconductor chips stacked at any number of levels, i.e., two levels and three or more levels.

Even where the semiconductor chip is packaged with the device formation surface thereof facing upward (in a face-up manner), electrode connection can be established with the use of the back electrode provided on the back face of the chip, so that the semiconductor chip can be connected directly to a printed board or the like. Further, higher density packaging can be achieved because provision of an underlying substrate is obviated.

The back electrode is preferably connected to the front electrode via a through-interconnection provided in the through-hole.

A front interconnection may be provided on the front face of the semiconductor substrate for connection between the through-interconnection and the front electrode.

A back interconnection may be provided on the back face of the semiconductor substrate for connection between the through-interconnection and the back electrode.

The front electrode may comprise a bump projecting from the front face of the semiconductor substrate. In this case, the back electrode, the through-interconnection, the front interconnection or the back interconnection is preferably composed of the same material as the bump.

Thus, the through-interconnection extending through the through-hole can easily be formed by plating or the like for bump formation. Further, electrical connection between vertically stacked semiconductor chips can be established by bump bonding. In addition, stresses exerted on the semiconductor chips can be absorbed by the bumps.

The bump material generally has properties suitable for the electrodes, i.e., a lower electrical resistance and a higher heat conductivity.

In addition, the back electrode, the through-interconnection, the front interconnection or the back interconnection can be formed simultaneously with the formation of the bump. In this case, the formation of any of these elements can be achieved without employing any other steps for element formation.

Of course, the back electrode, the through-interconnection, the front interconnection or the back interconnection may be formed in a later step after the formation of the bump on a pad electrode.

Where the front interconnection is composed of the same material as the bump, the bump can be used in place of a part of chip internal interconnection, so that further integration can be achieved.

The bump preferably has a greater height than the front interconnection.

The front or back face of the semiconductor substrate or the interior of the through-hole is preferably covered with an insulating film. The back electrode, the through-interconnection, the front electrode, the front interconnection or the back interconnection is preferably provided on the insulating film. Thus, a plurality of electrodes can electrically be isolated from each other. Particularly, where a semiconductor substrate such as of Ge or Si having a high electrical conductivity is employed, the insulation is required.

The front electrode may comprise an electrode pad which is a portion of an internal interconnection exposed from the insulating film provided on the front face of the semiconductor substrate.

The through-hole is preferably provided adjacent the electrode pad.

The bump is preferably provided on the electrode pad as covering the electrode pad.

The through-hole is provided just below the electrode pad. With this arrangement, the amount of the material (bump material) for the through-interconnection disposed in the through-hole can be minimized because the electrode pad and the through-hole are located in the same position as viewed in plan. This allows for resource saving and minimization of electrical resistance.

The foregoing and other objects, features and effects of the present invention will become more apparent from the following description of the preferred embodiments with reference to the attached drawings.

BRIEF DESCRIPTION OF THE DRAWINGS

FIGS. 2A to 2E are process diagrams for explaining a process for forming a bump in a through-hole in a semiconductor chip production process;

DESCRIPTION OF THE PREFERRED EMBODIMENTS

Although description will hereinafter be made on the premise that semiconductor chips are Si-based, any other semiconductors such as GaAs and Ge may be employed.

Figure 1:
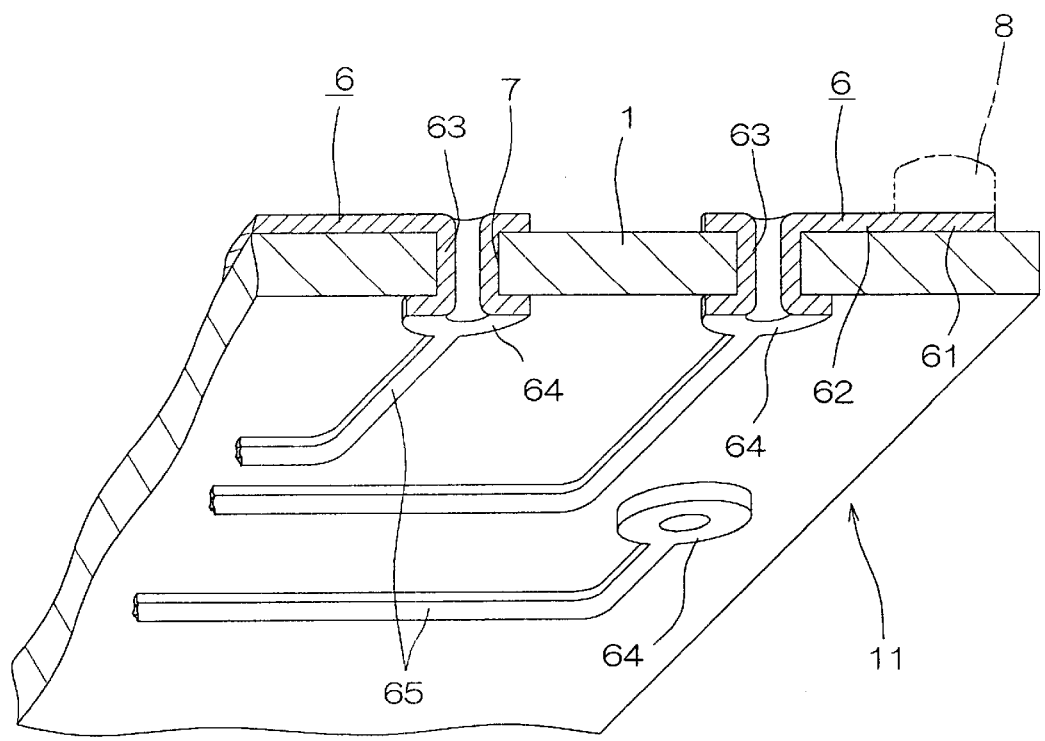
FIG. 1 is a sectional view illustrating a major portion of a semiconductor chip according to a first embodiment of the present invention.

FIG. 1 is a sectional view illustrating a major portion of a semiconductor chip 11 according to a first embodiment of the present invention. A plurality of through-holes 7 are formed in a device formation region of the semiconductor chip 11, and bump electrodes 6 respectively extend through the through-holes 7 onto front and back faces of a semiconductor substrate 1 which serves as a base of the semiconductor chip 11. More specifically, the bump electrodes 6 are projections formed by plating on a passivation film (not shown in FIG. 1) which covers the faces of the semiconductor substrate 1. The bump electrodes 6 each include a front electrode 61 provided on the front face of the semiconductor substrate on the side of the device formation surface, a through-interconnection 63 provided in the through-hole 7, a front interconnection 62 connecting the front electrode 61 and the through-interconnection 63, and a back electrode 64 projecting from the back face of the semiconductor substrate 1 and connected to the through-interconnection 63. The back electrode may be provided in a position remote from the through-hole 7 on the back face of the semiconductor substrate 1. In this case, the connection between the through-interconnection 63 and the back electrode may be established via a back interconnection 65.

FIGS. 2A to 2E are diagrams for explaining a process for forming a bump 6 which extends through a through-hole 7 onto front and back faces of a semiconductor substrate 1 in a semiconductor production process. The substrate 1 is preliminarily formed with the through-hole 7. FIG. 2A illustrates the step of forming a passivation film 3 such as of SiN, SiON, $SiO_2$ or PSG on the substrate 1 formed with an Al electrode 2 (an exposed portion of an internal interconnection) which serves as a pad electrode. The passivation film 3 covers the interior of the through-hole 7 and the back face of the substrate 1 as well.

As shown in FIG. 2B, a TiW alloy layer (barrier metal layer not shown) for improving adhesion to the underlying layer and a seed layer 4 such as of Au or Pt for power supply for electroplating are successively formed on the entire surfaces of the substrate 1 by electroless plating or the like.

In turn, a photoresist 5 is applied on the front and back faces of the semiconductor substrate 1 except portions thereof which are to be subjected to plating for bump formation (FIG. 2C).

A metal bump material 6 is thickly deposited, by an electroplating method, on portions of the front and back faces of the semiconductor substrate 1 and the interior of the through-hole 7 which are not covered with the photoresist (FIG. 2D). Examples of the metal bump material include oxidation-resistant metals such as Au, Pd, Pt, Ag and Ir (iridium).

Subsequently, the photoresist 5 is removed, and the seed layer 4 and the barrier metal layer on the resulting surface are removed. Then, the resulting substrate is subjected to an annealing process. Thus, a semiconductor chip having the bump 6 formed in the through-hole 7 is provided (FIG. 2E).

Thus, the semiconductor chip is formed with the bump 6 which includes the front electrode 61 provided on the Al electrode 2, the front interconnection 62 provided between the front electrode 61 and the through-interconnection 63 on the front face of the semiconductor substrate 1, and the back electrode 64 and the back interconnection 65 provided on the back face of the semiconductor substrate 1 and connected to the through-interconnection 63. It is noted that the Al electrode 2 and the front electrode 61 constitute a front connecting portion for electrical connection to a solid device from the front face of the semiconductor substrate 1.

Figure 3A:
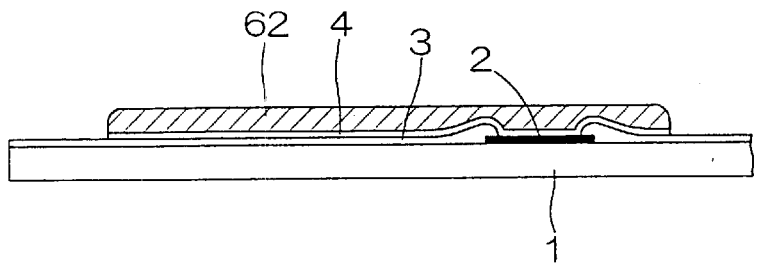
FIGS. 3A to 3E are process diagrams for explaining another bump formation process in which the through-hole is formed in a later step.
Figure 3B:
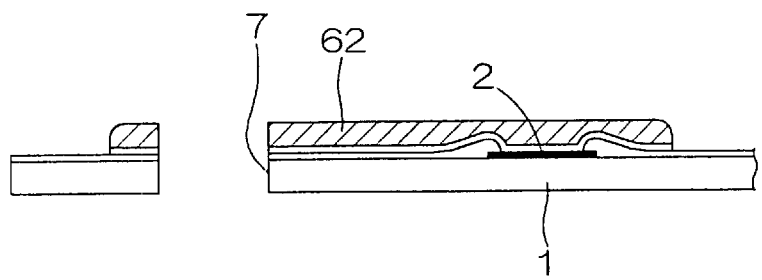

FIGS. 3A to 3E are process diagrams for explaining another production process in which the through-hole 7 is formed in a later step. FIG. 3A illustrates a state where a front interconnection 62 has been formed on a device formation surface of a semiconductor substrate 1.

Figure 3C:
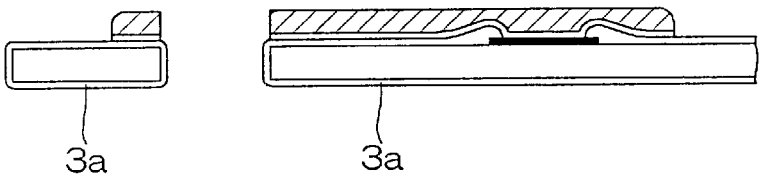
Figure 3D:
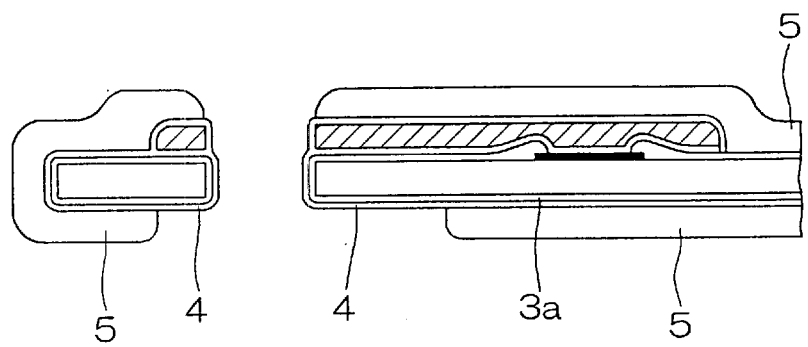

With this state, a through-hole 7 is formed in the substrate 1 (see FIG. 3B), and a passivation film 3a is formed on the interior of the through-hole 7 and the back face of the substrate 1 for isolation thereof (see FIG. 3C).

Thereafter, a TiW alloy layer (barrier metal layer not shown) for improving adhesion to the underlying layer and a seed film 4 such as of Au or Pt for power supply for plating are successively formed on the entire surfaces of the resulting substrate 1 by electroless plating or the like. Then, a photoresist 5 is applied on the front and back faces of the semiconductor substrate 1 except portions thereof which are to be subjected to plating for forming a bump around the through-hole 7 (see FIG. 3D).

Figure 3E:
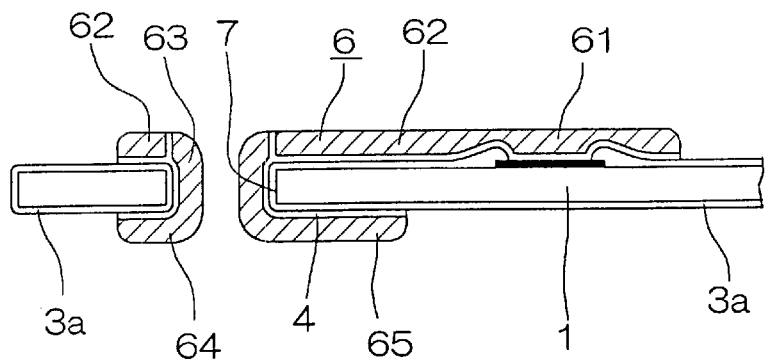

Then, a metal bump material 6 is thickly deposited, by electroplating or electroless plating, on portions of the front and back faces of the semiconductor substrate 1 and the interior of the through-hole 7 which are not covered with the photoresist. Subsequently, the photoresist 5 is removed, and the seed layer 4 and the barrier metal layer on the resulting surface are removed. Then, the resulting substrate is subjected to an annealing process. Thus, a semiconductor chip having the bump 6 formed in the through-hole 7 is provided (FIG. 3E).

Although the bump 6 thus formed in the aforesaid process has a uniform height, a bump (as indicated by a reference numeral 8 in FIG. 1) having a greater height may be formed on a part of the bump 6.

The semiconductor chip 11 formed through the production process shown in FIGS. 2A to 2E or FIGS. 3A to 3E has the electrode 6 (bump) connecting the front and back faces thereof through the through-hole 7.

Figure 4:
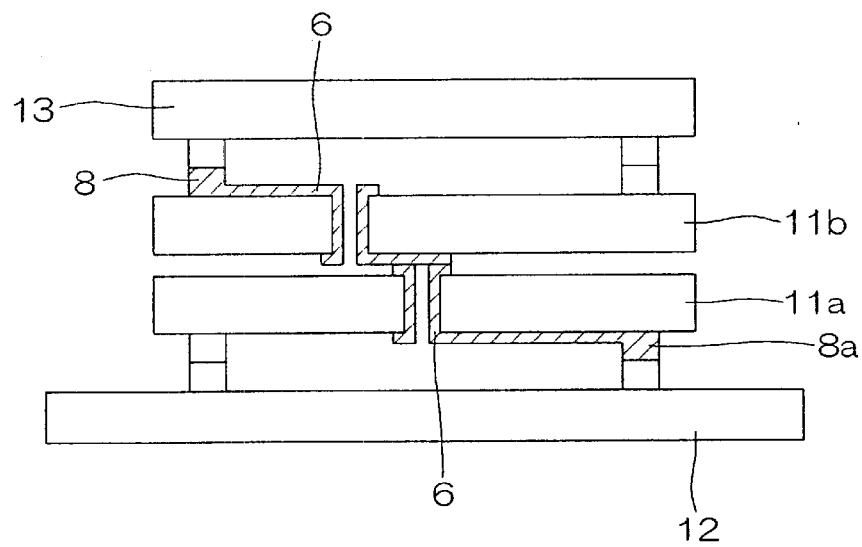
FIG. 4 is a sectional view illustrating a chip-on-chip structure in which bump electrodes each extend through a through-hole onto front and back faces of a chip.

Exemplary implementation of the semiconductor chip thus formed with the electrode 6 is shown in FIG. 4.

FIG. 4 is a sectional view illustrating the construction of a semiconductor device of chip-on-chip structure in which semiconductor chips are arranged in a quadruple-stacked relation. Semiconductor chips 11a, 11b each formed with a bump electrode 6 which extends through a through-hole 7 onto the front and back faces of a substrate 1 thereof are stacked on a semiconductor chip 12 which is to be connected to an underlying wiring board (not shown). A semiconductor chip 13 having normal bumps is stacked on top of the semiconductor chip 11b. A reference numeral 8 denotes a bump which projects from the bump electrode 6 (i.e., from a front interconnection 62) to a higher level. The bump 8 also constitutes part of a front electrode.

The semiconductor chips 11a and 11b are connected to each other via the bump electrodes 6 extending through the through-holes 7, thereby realizing a so-called back-to-back bonding structure.

With this structure, semiconductor chips can be stacked at a plurality of levels to a great height for size reduction of the semiconductor device. Theoretically, there is no limit to the number of levels at which the semiconductor chips are stacked.

Figure 5:
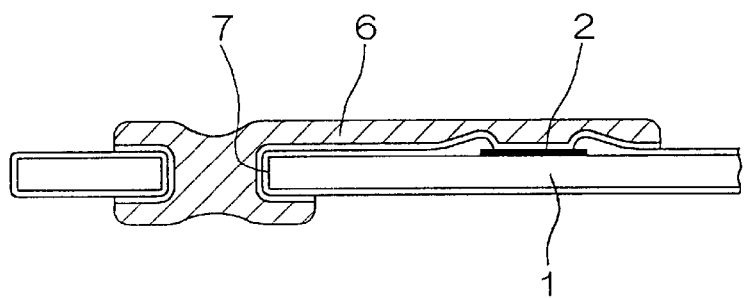
FIG. 5 is a sectional view of a semiconductor chip in which a through-hole is completely filled with an increased amount of a bump material.

Although a bump portion formed in the through-hole 7 has a center opening in the aforesaid embodiment, the through-hole 7 may completely be filled with the bump material, as shown in FIG. 5, by increasing the amount of the bump material filling the through-hole 7 or reducing the size of the through-hole 7.

Figure 6:
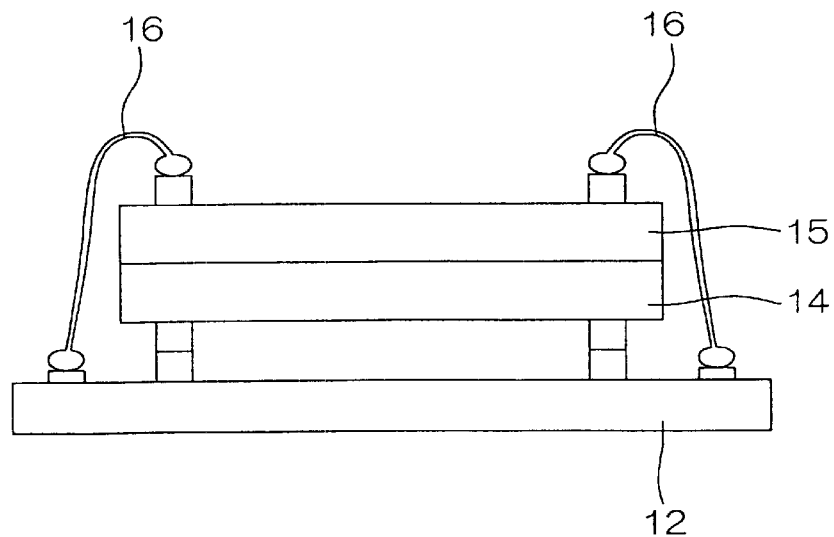
FIG. 6 is a diagram illustrating the construction of a semiconductor device in which semiconductor chips formed with no through-hole are bonded to each other in a back-to-back relation with the topmost semiconductor chip being wire-bonded.

FIG. 6 illustrates the construction of a semiconductor device in which semiconductor chips 14, 15 formed with no through-hole are bonded to each other in a back-to-back relation and stacked on a semiconductor chip 12 to be connected to an underlying wiring board with the topmost semiconductor chip 15 being connected to the semiconductor chip 12 by wires 16. Although this construction realizes a triple-level chip-on-chip structure without provision of the through-hole, wire-bonding is required for connection between the topmost semiconductor chip 15 and the semiconductor chip 12.

Figure 7:
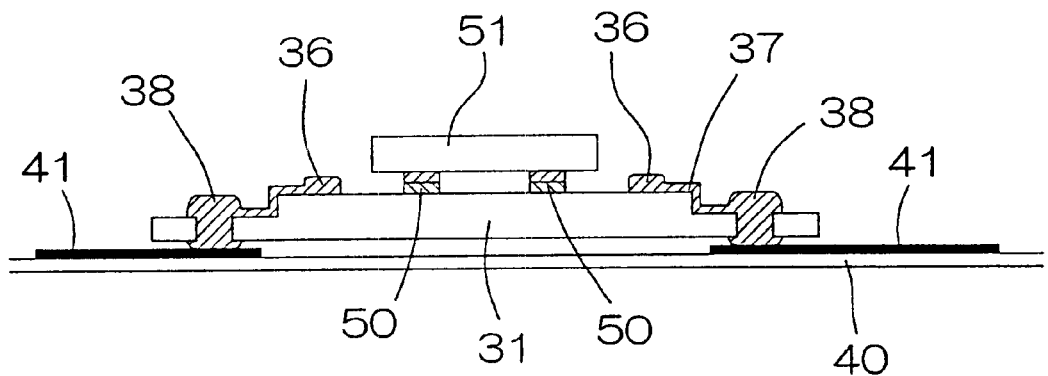
FIG. 7 is a sectional view illustrating implementation of a semiconductor device according to a second embodiment of the invention.

FIG. 7 is a sectional view illustrating implementation of a semiconductor device according to a second embodiment of the invention.

A plurality of bump electrodes 36, 50 are provided in a device formation region of an Si semiconductor chip 31, and another semiconductor chip 51 is rested on the bump electrodes 50. The bump electrodes 36 are each connected to an interconnection 37 provided on the front face of the chip 31. The interconnection 37 is connected to a metal bump portion 38 provided in a through-hole formed in the chip 31. The metal bump portion 38 is electrically connected to a lead 41 on a substrate 40 on the back side of the chip 31.

Figure 8:
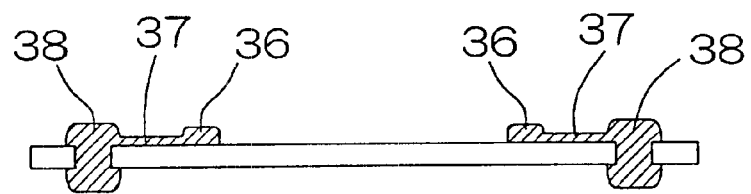
FIG. 8 is a sectional view illustrating a semiconductor chip having a bump formed in a through-hole.

FIG. 8 is a sectional view illustrating a modification of the Si semiconductor chip 31. A difference between the Si semiconductor chip and the semiconductor chip 31 of FIG. 7 is that the interconnections 37 respectively connected to the bump electrodes 36 have no step. However, the absence of the step is not critical.

An explanation will next be given to a production process for the Si semiconductor chip 31 shown in FIG. 8.

Figure 9A:
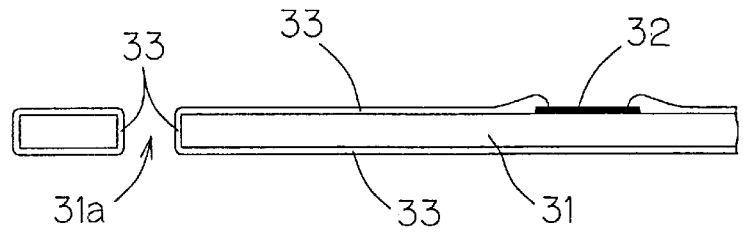
FIGS. 9A to 9E are process diagrams for explaining a production process for forming a bump which extends through a through-hole.

FIGS. 9A to 9E are process diagrams for explaining the production process. A substrate for the Si semiconductor chip 31 is preliminarily formed with a through-hole 31a. FIG. 9A illustrates a step in which a passivation film 33 such as of SiN, SiON, $SiO_2$ or PSG is formed on the substrate 31 formed with an Al electrode 32 (an exposed portion of an internal interconnection) which serves as a pad electrode.

The passivation film 33 covers the interior of the through-hole 31a and the back face of the substrate 31 as well. The formation of the passivation film 33 is achieved, for example, by plasma CVD.

Figure 9B:
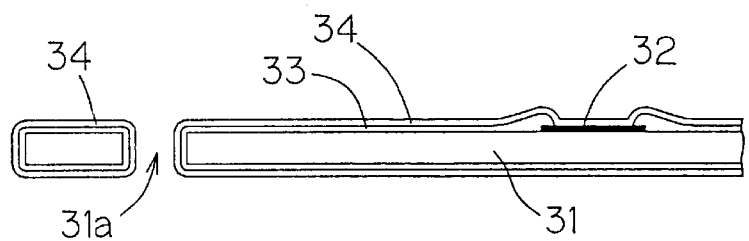

As shown in FIG. 9B, a TiW alloy layer (barrier metal layer) for improving adhesion to the underlying layer and a seed layer 34 such as of Au or Pt for power supply for plating are successively formed on the entire surfaces of the substrate 31 by vapor deposition such as sputtering.

Figure 9C:
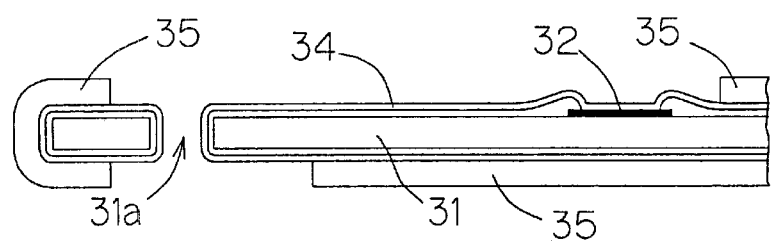

Then, a photoresist 35 is applied on the resulting surface except portions thereof which are to be subjected to plating for bump formation (FIG. 9C).

Figure 9D:
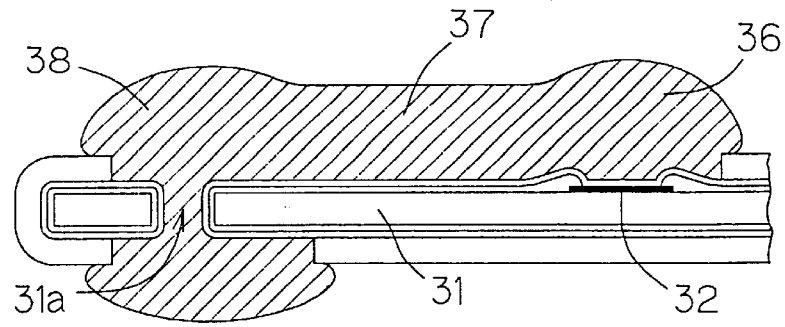

A metal bump material is thickly deposited on the resulting surface by an electroplating method (FIG. 9D). Examples of the metal bump material include Au, Pd, Pt, Ag, Ir (iridium) and Cu. Of the bump thus formed, a bump portion (front electrode) formed on the Al electrode 32 is denoted by a reference numeral 36, and bump portions (back electrode and through-interconnection) formed in and around the through-hole 31a are denoted by a reference numeral 38. A bump portion (front interconnection) for connection between the bump portions 36 and 38 is denoted by a reference numeral 37. Instead of the electroplating method, an electroless plating method may be employed which is a metal film formation method utilizing a reducing action by a chemical reaction.

Figure 9E:
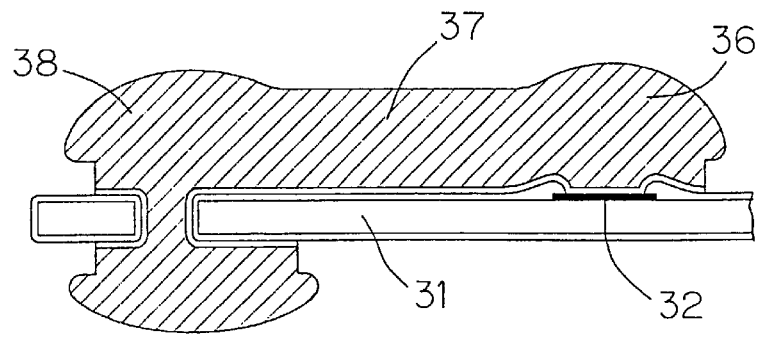

After the photoresist 35 is removed and the seed film 34 and the barrier metal layer on the resulting surface are removed, the resulting substrate is subjected to an annealing process. Thus, the semiconductor chip having the bump formed in the through-hole is provided (FIG. 9E).

Figure 10A:
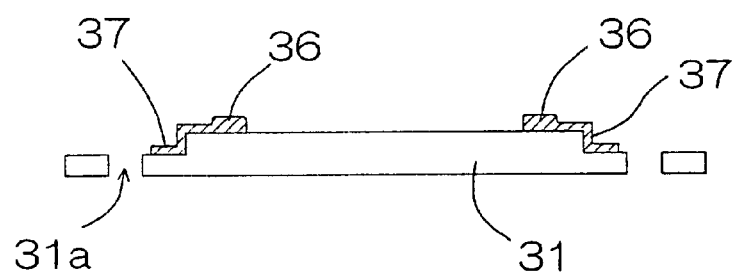
FIGS. 10A and 10B are schematic process diagrams for explaining another production process in which bumps are formed in through-holes in a later step.
Figure 10B:
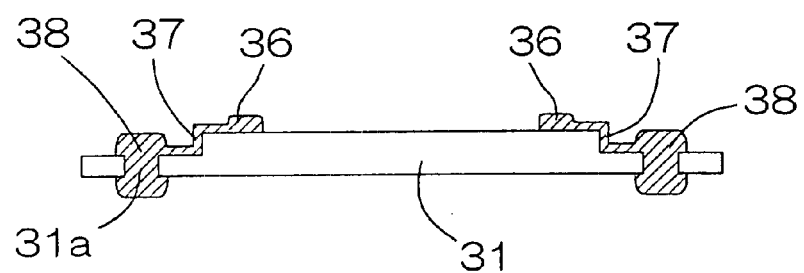

FIGS. 10A and 10B are schematic diagrams for explaining a production process for the Si semiconductor chip 31 having steps as shown in FIG. 7, in which the formation of the bump in the through-hole is achieved in a later step. First, bumps 36 and interconnections 37 connected thereto are formed on a device formation surface of a substrate, and then through-holes 31a are formed in the substrate (FIG. 10A). Subsequently, bumps 38 are formed in the through-holes 31a (FIG. 10B).

Figure 11A:
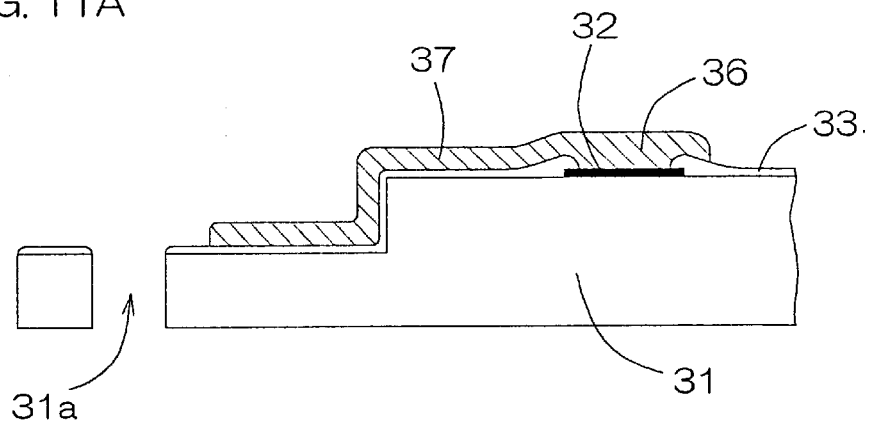
FIGS. 11A to 11C are process diagrams for explaining in greater detail the production process in which the formation of the bumps in the through-holes is achieved in the later step.
Figure 11B:
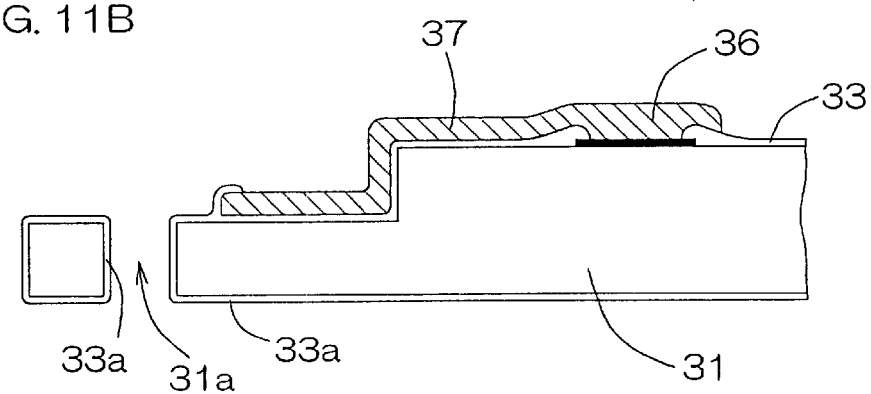
Figure 11C:
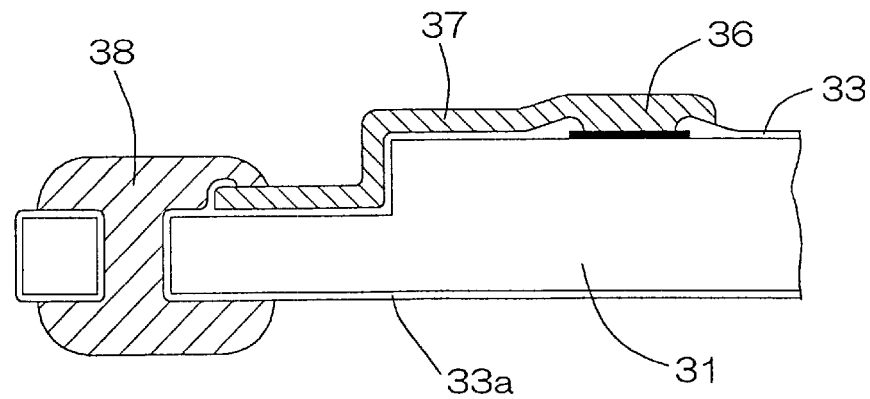

FIGS. 11A to 11C are process diagrams for explaining in greater detail the process in which the formation of the bumps 38 in the through-holes 31a is achieved in the later step. FIG. 11A illustrates the Si semiconductor chip 31 formed with the bump 36 on the Al electrode 32 on the device formation surface, the interconnection 37 connected to the bump 36, and the through-hole 31a. A reference numeral 33 denotes a passivation film.

With this state, the interior of the through-hole 31a and the back face of the substrate 31 are entirely covered with a passivation film 33a for isolation thereof. After the passivation film 33a except a bump formation portion thereof is covered with a resist film (not shown), only the bump formation portion of the passivation film is etched. Thereafter, the resist film is removed (see FIG. 11B). Since an oxide film is already formed on the surfaces of the substrate (31), the passivation film 33a may selectively be formed only on the back face of the substrate (31) and the interior of the through-hole 31a.

Then, a metal bump material 38 is thickly deposited in and around the through-hole 31a by electroplating or electroless plating (see FIG. 11C).

Figure 12:
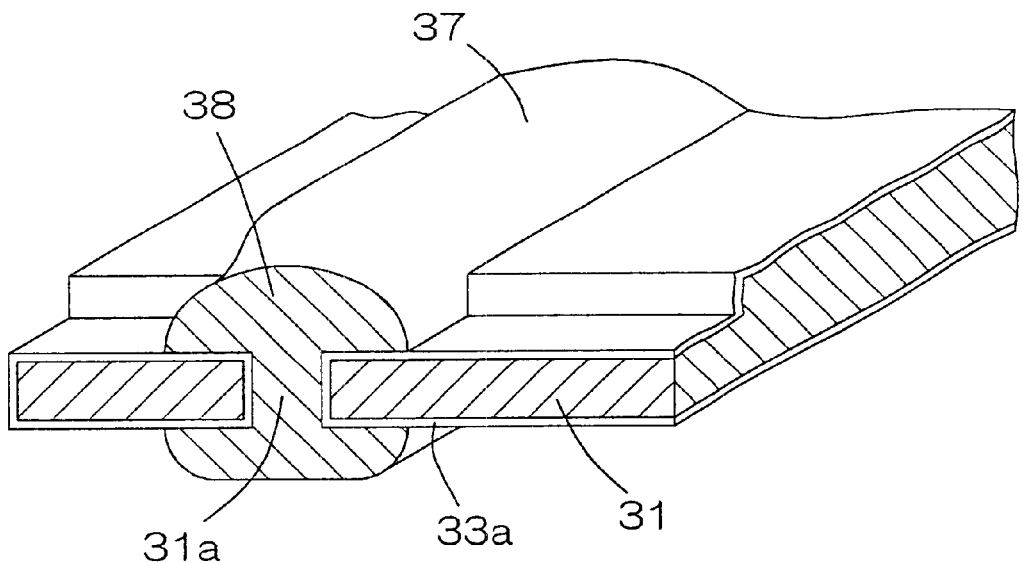
FIG. 12 is a sectional view illustrating the through-hole of the semiconductor chip having the bump formed therein.

A sectional view of the through-hole 31a thus formed in the semiconductor chip is shown in FIG. 12. The bump 38 connected to the interconnection 37 extends through the through-hole 31a. The bump 38 functions as the back electrode.

The semiconductor chip produced by the process shown in FIGS. 9A to 9E, FIGS. 10A, 10B or FIGS. 11A to 11C is formed with the back electrodes which respectively extend through the through-holes onto the back face thereof as shown in FIG. 7, 8 or 12.

As shown in FIG. 7, the back electrodes can be bonded directly to the leads 41 of the substrate 40 by soldering. This obviates the provision of the underlying substrate (wiring board) which is otherwise required in the prior art, thereby allowing for reduction in thickness and size of the semiconductor chip device. This arrangement is particularly effective where the chip-on-chip structure is employed in which the semiconductor device should be packaged with the device formation surface of the chip facing apart from the substrate (in a face-up manner).

Figure 13:
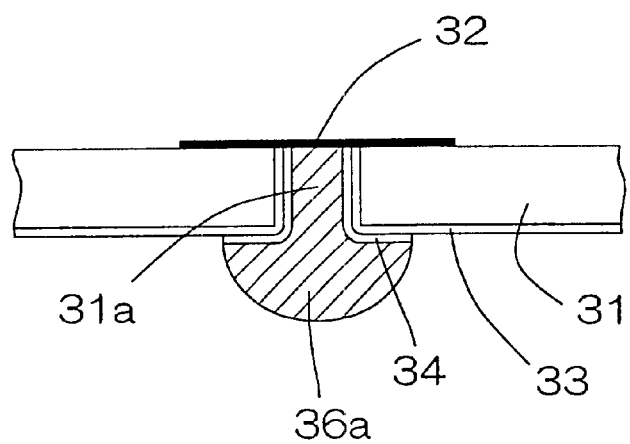
FIG. 13 is a sectional view illustrating an embodiment in which a through-hole extending to the back side of a semiconductor chip is formed just below a pad electrode on a device formation surface of the chip and a metal bump portion extends through the through-hole.

As shown in FIG. 13, the through-hole 31a may be formed just below a pad electrode 32, and a bump 36a may be formed in the through-hole 31a with the intervention of an insulating film 33 and a seed layer 34. The formation of the through-hole 31a may be achieved by utilizing an anisotropic etching technique.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application claims priority benefits under 35 USC Section 119 on the basis of Japanese Patent Applications No. 11-51208 and No. 11-51209 filed to the Japanese Patent Office on Feb. 26, 1999, and Japanese Patent Application No. 11-245855 filed to the Japanese Patent Office on Aug. 31, 1999, respectively, the disclosure thereof being incorporated herein by reference.

What is claimed is:

1. A semiconductor chip, comprising:
   a semiconductor substrate having a through-hole formed therein;
   a front electrode provided on a front face of the semiconductor substrate which is a device formation surface of the semiconductor substrate; and
   a back electrode provided on a back face of the semiconductor substrate and electrically connected to the front electrode via a through-interconnection provided in the through-hole,
   wherein the front electrode includes a bump projecting from the front face of the semiconductor substrate, and
   wherein the back electrode and the through-interconnection are composed of the same material as the bump.

2. A semiconductor chip as set forth in claim 1, further comprising a front interconnection provided on the front face of the semiconductor substrate for connection between the through-interconnection and the front electrode.

3. A semiconductor chip as set forth in claim 2, wherein the bump has a greater height than the front interconnection.

4. A semiconductor chip, comprising:
   a semiconductor substrate having a through-hole formed therein;
   a front electrode provided on a front face of the semiconductor substrate which is a device formation surface of the semiconductor substrate;
   a back electrode provided or a back face of the semiconductor substrate and electrically connected to the front electrode via a through-interconnection provided in the through-hole; and a back interconnection provided on the back face of the semiconductor substrate for connection between the through-interconnection and the back electrode,
wherein the front electrode includes a bump protecting from the front face of the semiconductor chip, and
wherein the back electrode, the through-interconnect on and the back interconnection are composed of the same material as the bump.

5. A semiconductor chip, comprising:

a semiconductor substrate having a through-hole formed therein;

a front electrode provided on a front face of the semiconductor substrate which is a device formation surface of the semiconductor substrate; and a back electrode provided on a back face of the semiconductor substrate and electrically connected to the front electrode via a through-interconnection provided in the through-hole,
wherein an insulating film is provided on an interior of the through-hole and on portions of the front and back faces of the semiconductor substrate adjacent to the through-hole, and
wherein the through-interconnection and the front electrode are provided on the insulating film.

6. A semiconductor chip, comprising:

a semiconductor substrate having a through-hole formed therein;

a front electrode provided on a front face of the semiconductor substrate which is a device formation surface of the semiconductor substrate;

a back electrode provided on a back face of the semiconductor substrate and electrically connected to the front electrode via a through-interconnection provided in the through-hole; and a front interconnection provided on the front face of the semiconductor substrate for connection between the through-interconnection and the front electrode,
wherein an insulating film is provided on an interior of the through-hole and on the front face of the semiconductor substrate, and
wherein the through-interconnection and the front interconnection are provided on the insulating film.

7. A semiconductor chip, comprising:

a semiconductor substrate having a through-hole formed therein;

a front electrode provided on a front face of the semiconductor substrate which is a device formation surface of the semiconductor substrate;

a back electrode provided on a back face of the semiconductor substrate and electrically connected to the front electrode via a through-interconnection provided in the through-hole; and a back-interconnection provided on the back face of the semiconductor substrate for connection between the through-interconnection and the back electrode,
wherein an insulating film is provided on an interior of the through-hole and on the back face of the semiconductor substrate, and
wherein the through-interconnection and the back interconnection are provided on the insulating film.

8. A semiconductor chip, comprising:

a semiconductor substrate having a through-hole formed therein;

a front electrode provided on a front face of the semiconductor substrate which is a device formation surface of the semiconductor substrate; and a back electrode provided on a back face of the semiconductor substrate and electrically connected to the front electrode through the through-hole,
wherein the front electrode includes an electrode ad which is a portion of an internal interconnection exposed from an insulating film provided on the front face of the semiconductor substrate.

9. A semiconductor chip as set forth in claim 8, wherein the through-hole is provided adjacent the electrode pad.

10. A semiconductor chip as set forth in claim 8, wherein a bump is provided on the electrode pad as covering the electrode pad.

11. A semiconductor chip as set forth in claim 8, wherein the through-hole is provided just below the electrode pad, and a through-interconnection is provided in the through-hole for connection between the back electrode and the electrode pad.

* * * * *